(12) United States Patent
Cleereman et al.

(10) Patent No.: US 8,938,920 B2
(45) Date of Patent: Jan. 27, 2015

(54) PHOTOVOLTAIC DEVICE AND METHOD

(75) Inventors: Robert J. Cleereman, Midland, MI (US); Michael J. Lesniak, Kawkawlin, MI (US); James R. Keenihan, Midland, MI (US); Joe A. Langmaid, Caro, MI (US); Ryan Gaston, Midland, MI (US); Gerald K. Eurich, Merrill, MI (US); Michelle L. Boven, Midland, MI (US)

(73) Assignee: Dow Global Technologies LLC, Midland, MI (US)

(*) Notice: Subject to any disclaimer, the term of this patent is extended or adjusted under 35 U.S.C. 154(b) by 255 days.

(21) Appl. No.: 12/989,745

(22) PCT Filed: May 1, 2009

(86) PCT No.: PCT/US2009/042496
§ 371 (c)(1),
(2), (4) Date: Jan. 5, 2011

(87) PCT Pub. No.: WO2009/137348
PCT Pub. Date: Nov. 12, 2009

(65) Prior Publication Data
US 2011/0100436 A1 May 5, 2011

Related U.S. Application Data

(60) Provisional application No. 61/050,341, filed on May 5, 2008, provisional application No. 61/098,941, filed on Sep. 22, 2008, provisional application No. 61/149,451, filed on Feb. 3, 2009.

(51) Int. Cl.
*E04D 13/18* (2014.01)
*E04H 14/00* (2006.01)
(Continued)

(52) U.S. Cl.
CPC ............ *H01R 12/79* (2013.01); *H01L 31/0485* (2013.01); *H01L 31/05* (2013.01);
(Continued)

(58) Field of Classification Search
CPC ..... Y02B 10/12; Y02E 10/50; F24D 2200/14; E04D 13/033
USPC ........................................ 52/173.3; 136/251
See application file for complete search history.

(56) References Cited

U.S. PATENT DOCUMENTS 4,040,867 A 8/1977 Forestieri et al.
4,321,416 A 3/1982 Tennant
(Continued)

FOREIGN PATENT DOCUMENTS

DE 2757765 B1 2/1979
EP 867041 A1 9/1998
(Continued)

OTHER PUBLICATIONS

Office Action Mailed Jul. 31, 2012 for JP 2011-507677 national application of PCTUS2009/042496.
(Continued)

*Primary Examiner* — Brian Glessner
*Assistant Examiner* — Paola Agudelo

(57) ABSTRACT

The present invention is premised upon an improved photovoltaic device ("PVD") and method of use, more particularly to an improved photovoltaic device with an integral locator and electrical terminal mechanism for transferring current to or from the improved photovoltaic device and the use as a system.

17 Claims, 12 Drawing Sheets

(51) Int. Cl.
*H01R 12/79* (2011.01)
*H01L 31/048* (2014.01)
*H01L 31/05* (2014.01)
*H01R 31/00* (2006.01)
*H01L 31/18* (2006.01)
*H01R 13/05* (2006.01)
*H01R 13/11* (2006.01)

(52) U.S. Cl.
CPC ........... *H01R 31/00* (2013.01); *H01L 31/0482* (2013.01); *H01L 31/0508* (2013.01); *H01L 31/18* (2013.01); *H01R 13/055* (2013.01); *H01R 13/113* (2013.01); *Y02B 10/12* (2013.01); *Y02E 10/50* (2013.01)
USPC .......................................... 52/173.3; 136/251

(56) References Cited

U.S. PATENT DOCUMENTS

| | | | |
|---|---|---|---|
| 4,322,261 A | 3/1982 | Dubois | |
| 4,830,038 A | 5/1989 | Anderson et al. | |
| 5,008,062 A | 4/1991 | Anderson et al. | |
| 5,164,020 A * | 11/1992 | Wagner et al. | 136/251 |
| 5,437,735 A | 8/1995 | Younan et al. | |
| 5,575,861 A * | 11/1996 | Younan et al. | 136/251 |
| 5,590,495 A | 1/1997 | Bressler et al. | |
| 5,647,915 A | 7/1997 | Zukerman | |
| 5,743,970 A | 4/1998 | Czubatjy et al. | |
| 7,049,803 B2 | 5/2006 | Dorner et al. | |
| 7,328,534 B2 | 2/2008 | Dinwoodie | |
| 7,387,537 B1 * | 6/2008 | Daily et al. | 439/620.22 |
| 7,713,089 B2 | 5/2010 | Faust et al. | |
| 2004/0000334 A1 * | 1/2004 | Ressler | 136/251 |
| 2006/0225776 A1 | 10/2006 | Nemazi et al. | |
| 2006/0266406 A1 | 11/2006 | Faust et al. | |
| 2007/0084501 A1 | 4/2007 | Kalberlah et al. | |
| 2007/0157963 A1 | 7/2007 | Metten et al. | |
| 2007/0193618 A1 | 8/2007 | Bressler et al. | |
| 2008/0035140 A1 | 2/2008 | Placer et al. | |
| 2008/0149170 A1 * | 6/2008 | Hanoka | 136/251 |
| 2008/0271773 A1 * | 11/2008 | Jacobs et al. | 136/244 |
| 2008/0302409 A1 * | 12/2008 | Bressler et al. | 136/251 |
| 2009/0025314 A1 * | 1/2009 | Komamine et al. | 52/173.3 |
| 2009/0320389 A1 * | 12/2009 | White | 52/173.3 |
| 2010/0105245 A1 * | 4/2010 | Good et al. | 439/571 |
| 2010/0180523 A1 * | 7/2010 | Lena et al. | 52/173.3 |
| 2012/0124921 A1 * | 5/2012 | Shiao et al. | 52/173.3 |

FOREIGN PATENT DOCUMENTS

| | | | |
|---|---|---|---|
| EP | 1744372 A2 | 1/2007 | |
| EP | 1813738 A1 | 8/2007 | |
| JP | 57-031236 U | 2/1982 | |
| JP | 58021874 A | 2/1983 | |
| JP | 10115051 A | 5/1998 | |
| JP | 11-040835 | 2/1999 | |
| JP | 11-040835 A | 2/1999 | |
| JP | 2005-009130 | 1/2005 | |
| JP | 2005-009130 A | 1/2005 | |
| JP | 2005072101 A | 3/2005 | |
| JP | 2006-147905 A | 6/2006 | |
| JP | 2006286748 A | 10/2006 | |
| JP | 2007-019140 | 1/2007 | |
| JP | 2007-019140 A | 1/2007 | |
| WO | WO 2008139102 A2 * | 11/2008 | |
| WO | 2009/137347 | 11/2009 | |
| WO | 2009/137352 | 11/2009 | |
| WO | 2009/137353 | 11/2009 | |

OTHER PUBLICATIONS

International Search Report for PCT/US2009/042496 dated Jan. 28, 2010.

Office Action for corresponding JP Application No. 2011-507677, dated May 7, 2013. Received Aug. 15, 2013.

European Office Action dated Jan. 13, 2014 for European Patent Application No. 09743335.3.

Translation of Japanese Office Action for Japanese Application No. 2013185291; Dated Jul. 15, 2014.

* cited by examiner

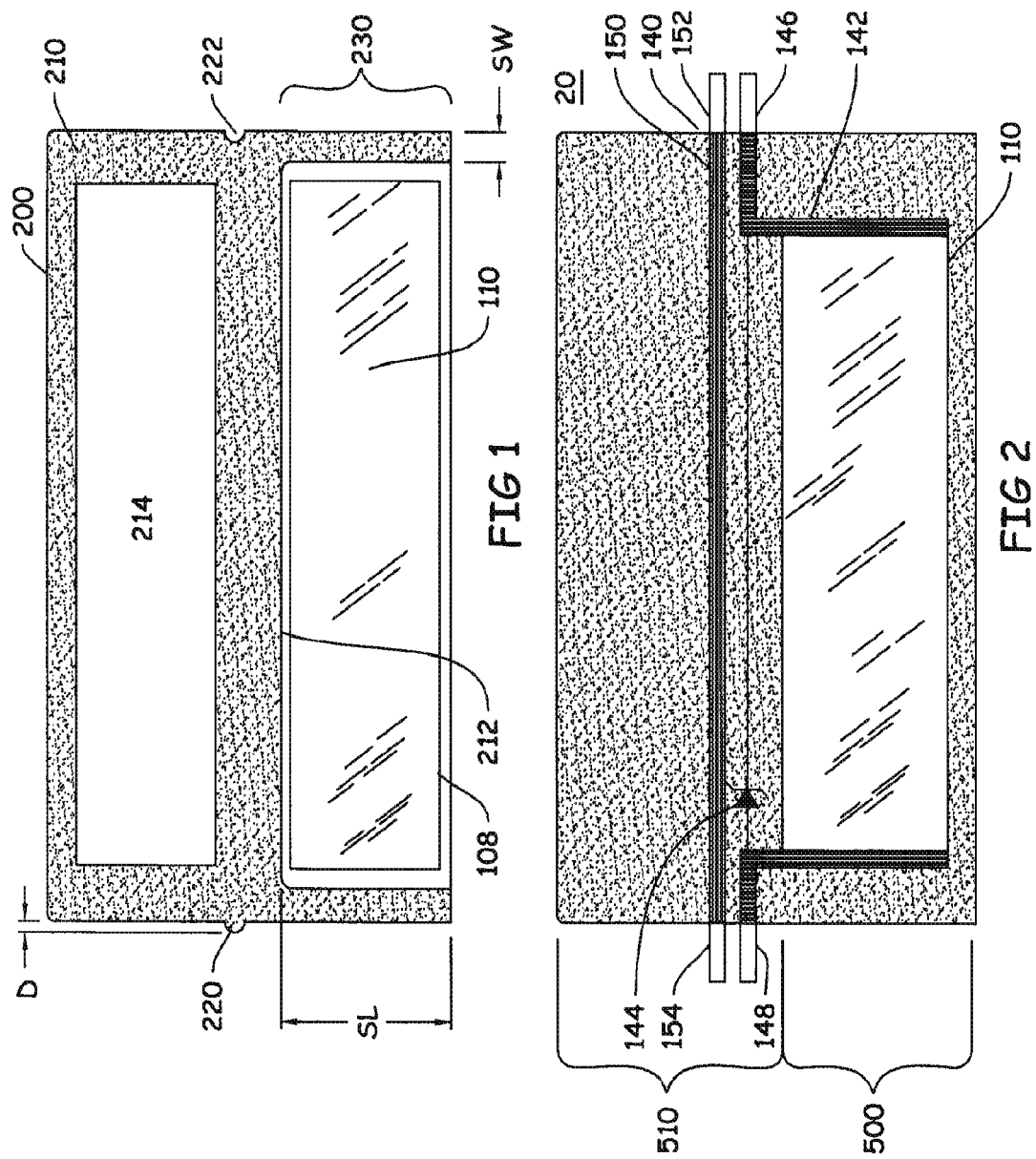

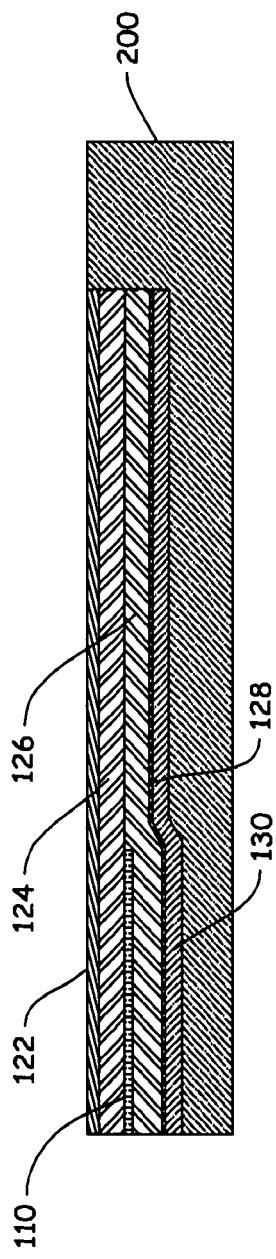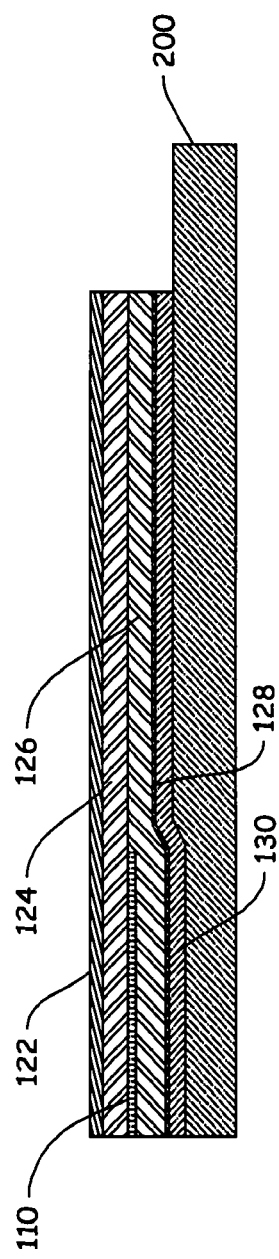

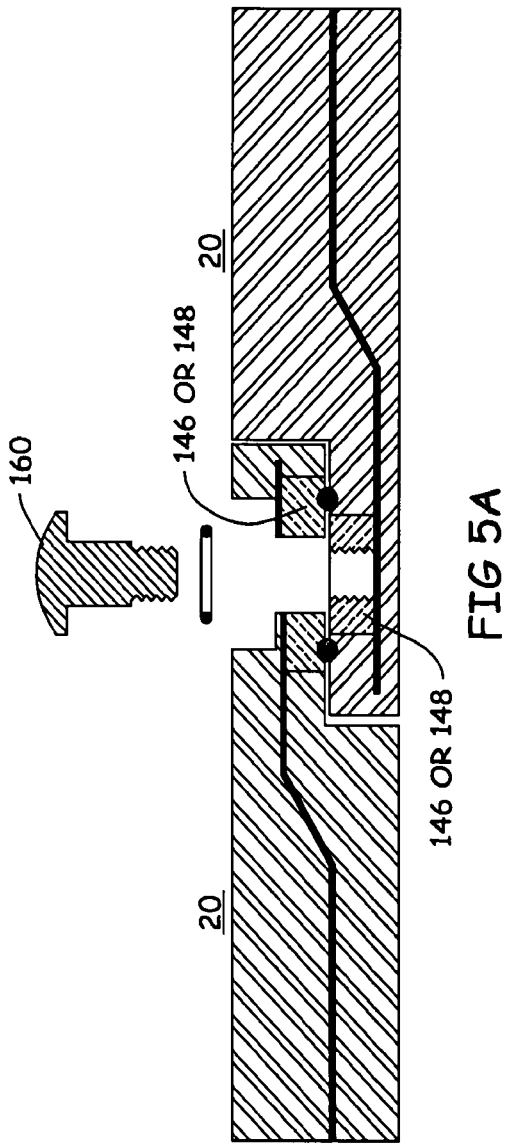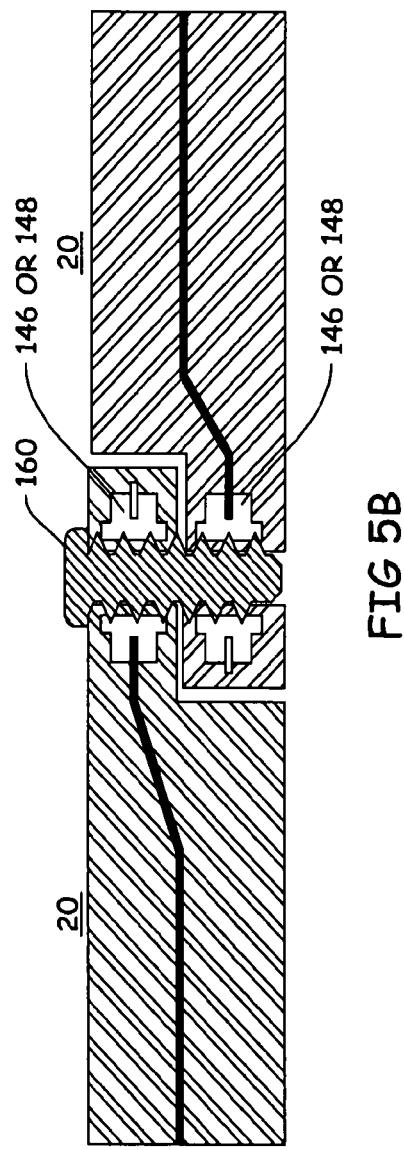

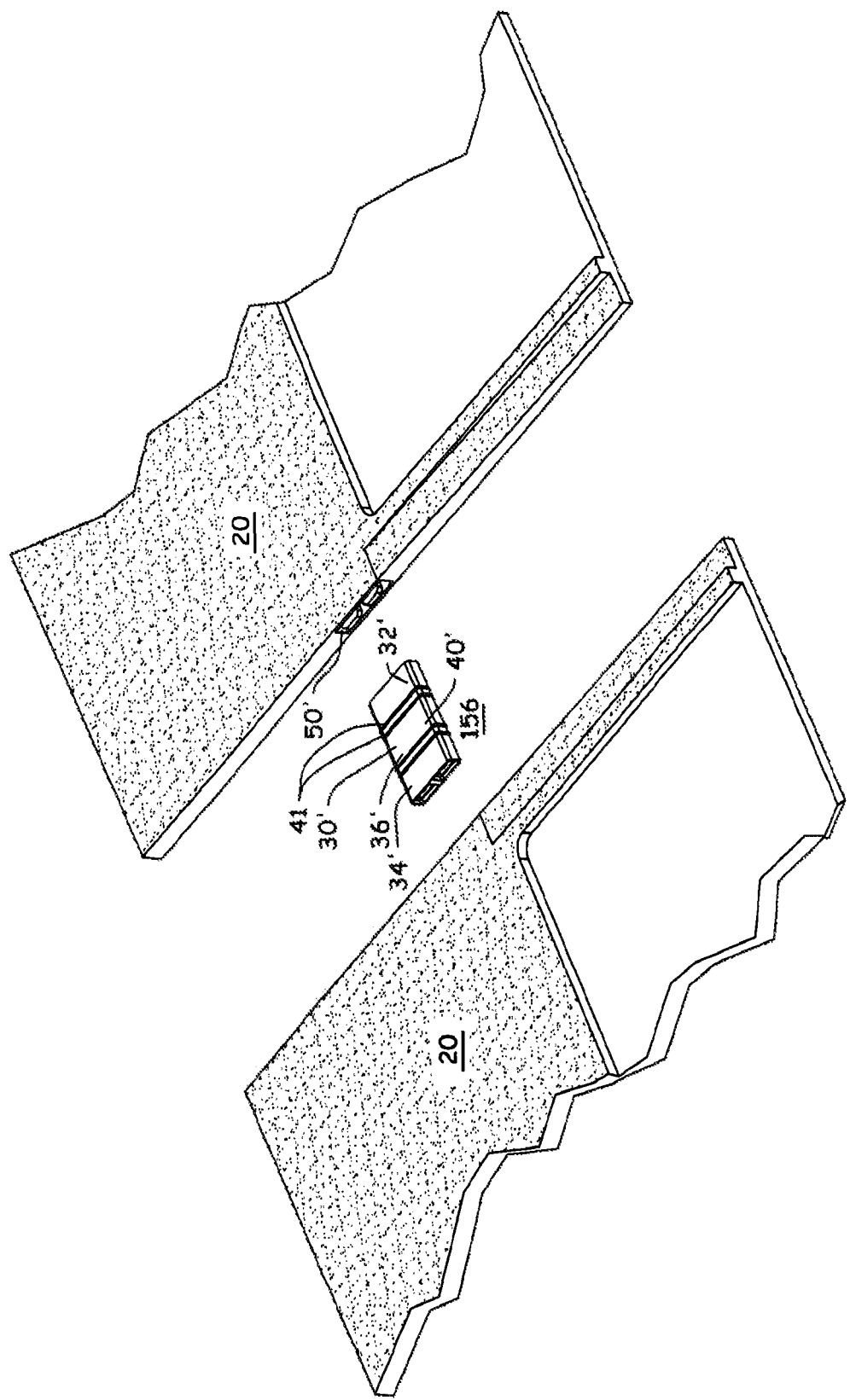

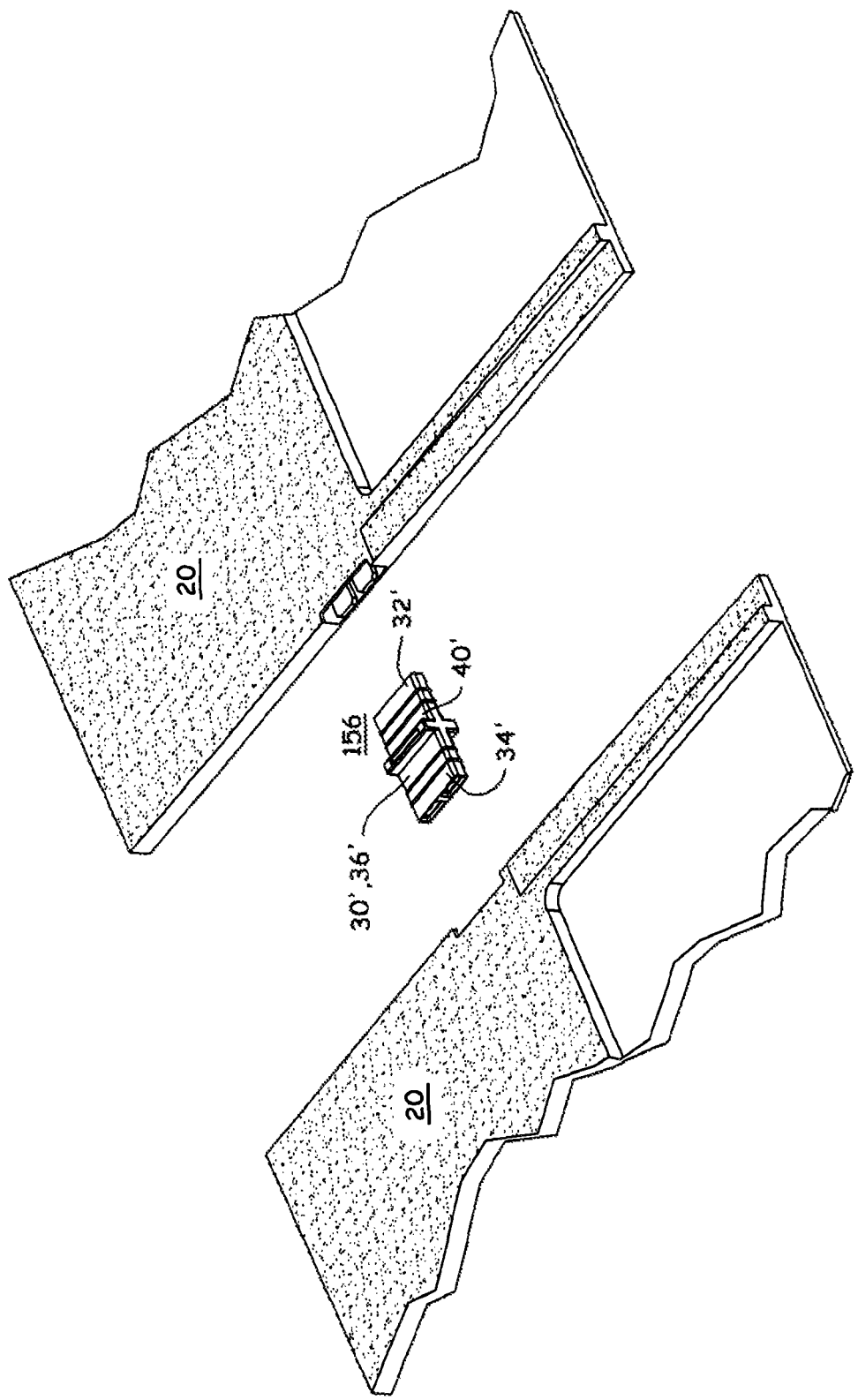

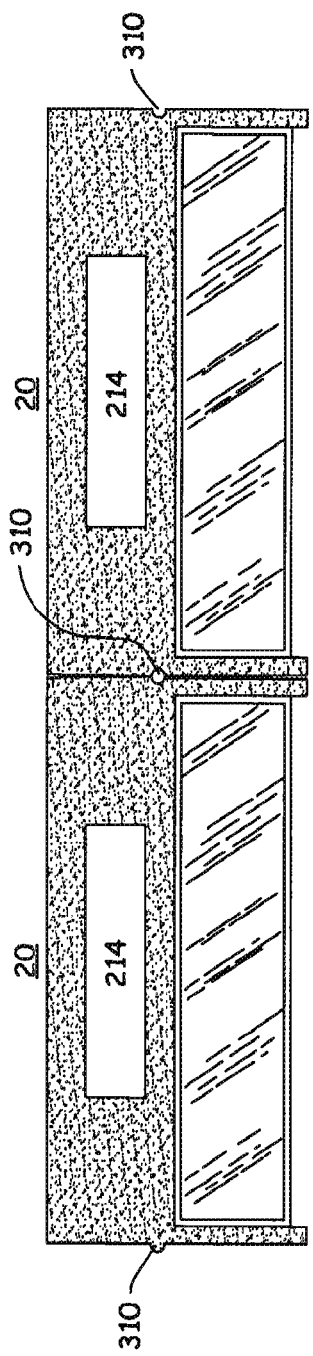
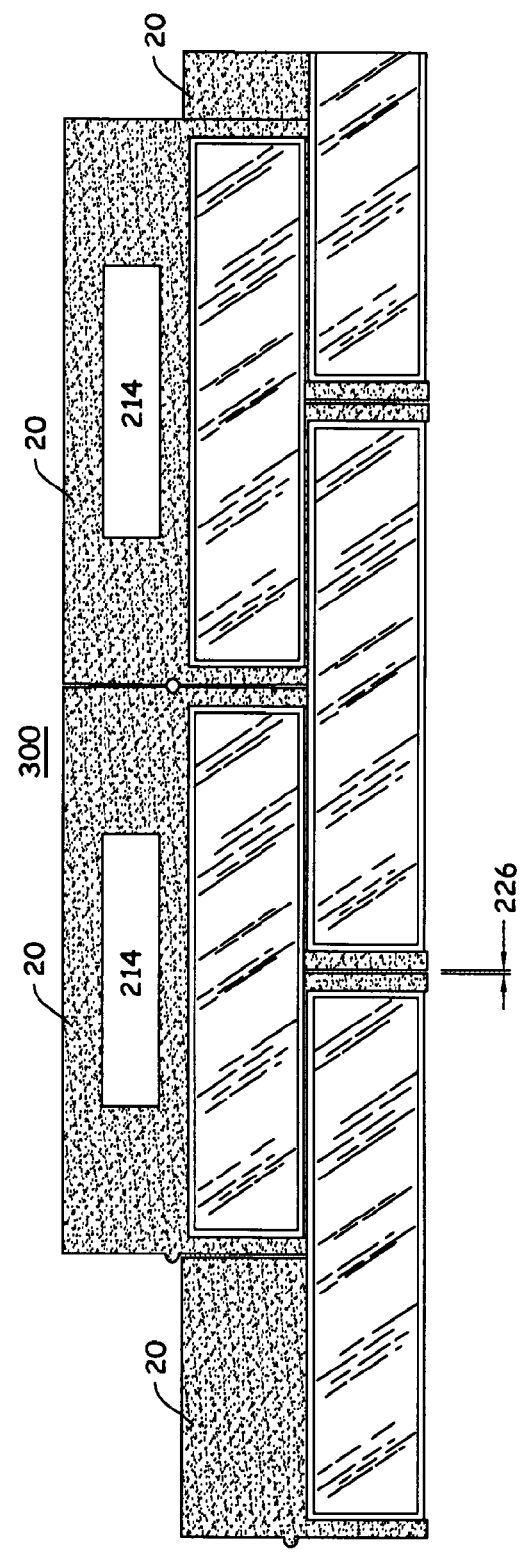

PHOTOVOLTAIC DEVICE AND METHOD

CLAIM OF PRIORITY

The present application claims the benefit of the filing date of PCT Application Serial No. PCT/US2009/042496 (filed May 1, 2009) ( Published as WO 2009/137348); U.S. Provisional Application Serial No. 61/050,341 (filed 5 May 2008); 61/098,941 U.S. Provisional Application Ser. No. 61/098,941 (filed 22 Sep. 22, 2008) and U.S. Provisional Application Ser. No. 61/149,451 (filed 3 Feb. 2009), the contents of which are hereby incorporated by reference in their entirety.

This invention was made with U.S. Government support under contract DE-FC36-07G01754 awarded by the Department of Energy. The U.S. Government has certain rights in this invention.

FIELD OF THE INVENTION

The present invention relates to an improved photovoltaic device ("PVD") and method of use, more particularly to an improved photovoltaic device with an integral locator and electrical terminal mechanism for transferring current to or from the improved photovoltaic device and the use as a system.

BACKGROUND

Efforts to improve PV devices, particularly those devices that are integrated into building structures (e.g. roofing shingles or exterior wall coverings), to be used successfully, should satisfy a number of criteria. The PV device should be durable (e.g. long lasting, sealed against moisture and other environmental conditions) and protected from mechanical abuse over the desired lifetime of the product, preferably at least 10 years, more preferably at least 25 years. The device should be easily installed (e.g. installation similar to conventional roofing shingles or exterior wall coverings) or replaced (e.g. if damaged). It may be desirable to provide a means of electrically connecting individual PV devices to one another and then to the balance of the system (BOS). Additionally, the PV device should transmit, at least on the front surface, UV and visible light without degrading the material of the front surface layer.

To make this full package desirable to the consumer, and to gain wide acceptance in the marketplace, the system should be inexpensive to build and install. This may help facilitate lower generated cost of energy, making PV technology more competitive relative to other means of generating electricity.

PV devices are commercially available today but they suffer from one or more deficiencies. In some cases, particularly in roof applications, multiple roof penetrations may have to be made, resulting in the roof which may have to be subsequently sealed against leaks. In other instances, extensive wiring may be required to connect the PV system together. The roof penetrations and/or extensive wiring can make installation time consuming and expensive.

Also, current PV devices may also include functional deficiencies due to their methods of construction. Laminated PV devices that do not have encapsulated edges may present mechanical and environmental challenges for the laminate. PV devices with secondary perimeter edges may address this problem, but, due to the resulting thickness changes at the edge from this same protecting addition, can be susceptible to fouling from dust, moisture, and other materials.

Existing art fastening systems for PV devices may allow for the device to be directly mounted to the building structure or they may fasten the devices to battens, channels or "rails" ("stand-offs") above the building exterior (e.g. roof deck or exterior cladding). These systems may be complicated, typically do not install like conventional cladding materials (e.g. roofing shingles or siding) and, as a consequence, may be expensive to install. Also, they may not be visually appealing as they do not look like conventional building materials. "Stand-offs" to mount PV device every 2-4 feet may be required. Thus, installation cost can be as much or more than the cost of the article. For example, a primary disadvantage of this type of mounting system is that it needs to be weather protected itself. In other words, the stand-offs are externally mounted to the roofing system and penetrate it, providing a potential water leakage site. To prevent this, each stand-off must be weatherized individually which is costly, time consuming, and undependable.

Locating and/or electrical connection features are not necessarily incorporated (depends on specific prior art reference). Existing art locating features do not take into consideration the variability in most building structures, particularly in roof structures, and may not be, or are not, consistent with existing roofing materials and designs. Notwithstanding these advancements, there remains a desire to present alternative solutions for various applications.

Among the literature that may pertain to this technology include the following patent documents: U.S. Pat. No. 4,040,867; U.S. Pat. No. 4,321,416; U.S. Pat. No. 4,322,261; U.S. Pat. No. 5,575,861; U.S. Pat. No. 5,743,970; U.S. Pat. No. 5,647,915; U.S. Pat. No. 5,590,495; US20060225776; US20060266406; US20070084501; US 2008/0035140 A1; U.S. Pat. No. 7,328,534 B2; U.S. Pat. No. 4,830,038; U.S. Pat. No. 5,008,062; U.S. Pat. No. 5,164,020; U.S. Pat. No. 5,437,735; U.S. Pat. No. 7,049,803; JP-A-58021874; DE-A-2757765; EP867041; EP1744372; U.S. Provisional Application Nos. 61/050,341 (filed 5 May 2008); 61/098,941 (filed 22 Sep. 2008); 61/149,451 (filed 3 Feb. 2009), and PCT Applications filed concurrently for attorney docket Nos. 67558-WO-PCT (1062A-016WO); 67666-WO-PCT (1062A-017WO); and 68428-WO-PCT (1062A-019WO), all incorporated herein by reference for all purposes.

SUMMARY OF THE INVENTION

The present invention is directed to a PV device that is durable, easily installed and provides a connection means for easily connecting the devices together both physically and electrically for installation on a building structure. It should be appreciated that the present invention assumes that the "building structure" could include for example, roof decking, an exterior wall, stand alone platform (e.g. solar farm), and/or an awning on a building, all with or without a protective sheath (e.g. felt, tar paper, foil liner, insulation material or the like).

Accordingly, pursuant to one aspect of the present invention, there is contemplated a photovoltaic device including a photovoltaic cell assembly including at least one peripheral edge, at least one photovoltaic cell inboard of the at least one peripheral edge, a photoactive portion, and at least one buss terminal for transferring current to or from the photovoltaic cell assembly, the at least one photovoltaic cell including a surface that allows transmission of light energy to the photoactive portion for conversion into electrical energy; a body portion including lower surface portion that contacts a building structure, and an upper surface portion that receives a fastener that attaches the photovoltaic device to the building structure; wherein the body portion is at least partially joined to at least one edge portion of the photovoltaic cell assembly along at least a portion of a bottom segment of the body portion while leaving the surface of the at least one photovoltaic cell exposed, and further wherein the body portion includes a locator adapted to locate the photovoltaic device relative to another photovoltaic device during installation of the device on the building structure.

The invention may be further characterized by one or any combination of the features described herein, such as the locator includes at least one electrical terminal; the photovoltaic device is flexible and conforms to an irregular contour in the building structure; the locator is included in a separate connector, an embedded connector, or a photovoltaic device connector assembly; the upper surface portion includes a fixation area; the body support portion is comprised essentially of a polymeric framing material and wherein the photovoltaic cell assembly is framed on at least 3 sides with the polymeric framing material; an edge of the polymeric framing material seals and protects the photovoltaic cell assembly against the environment without the use of secondary adhesives (e.g. butyl based adhesives which are common in the PV industry).

Accordingly, pursuant to another aspect of the present invention, there is contemplated a method of installing a photovoltaic system on a building structure, including at least the steps of: a) providing a first photovoltaic device including at least one locator, wherein the at least one locator includes at least one integrally formed electrical terminal located in an inactive portion of the first photovoltaic device; b) providing a second photovoltaic device including at least one locator, wherein the at least one locator includes at least one integrally formed electrical terminal located in an inactive portion of the second photovoltaic device; c) attaching a first photovoltaic device to the building structure by affixing a fastener through an inactive portion of the first photovoltaic device; d) attaching the second photovoltaic device to the building structure by affixing a fastener through the inactive portion of the second photovoltaic device; and e) connecting the at least one integrally formed electrical terminal of the first photoelectric device to the at least one integrally formed electrical terminal of the second photoelectric device.

The invention may be further characterized by one or any combination of the features described herein, such as steps c, d, and e can occur in any order; including the step of placing a fastener through a hole in the at least one integrally formed electrical terminal of the first photoelectric device and through a hole in the at least one integrally formed electrical terminal of the additional photoelectric devices to accomplish the electrical connection; the fastener is a screw; including a photovoltaic device connector assembly to accomplish the electrical connection.

Accordingly, pursuant to yet another aspect of the present invention, there is contemplated a photovoltaic device including at least an active portion including a photovoltaic cell assembly; an inactive portion for attaching the photovoltaic device to a building structure; and at least one locator to control alignment between adjacent photovoltaic devices which locator comprises an electrical terminal.

The invention may be further characterized by one or any combination of the features described herein, such as the inactive portion includes a fixation area such that the photovoltaic device may be fixed to a building structure without interfering with the at least one electrical terminal; the fixation area includes at least one marking for designation of a fastening zone for fastening the photovoltaic device to the building structure; the at least one electrical terminal are located in the inactive portion of the photovoltaic device such that, when installed, they are covered by the active portion of a next higher photovoltaic devices; the active portion is framed on at least 3 sides with a thermoplastic framing material, further wherein the polymeric framing material contains electrical circuitry and the locator; an edge of the thermoplastic framing material seal and protect the active portion against the environment without the use of additional adhesives; there are at least two locators disposed on opposing sides of the photovoltaic device; and including a return circuit.

It should be appreciated that the above referenced aspects and examples are non-limiting, as others exist within the present invention, as shown and described herein.

DESCRIPTION OF THE DRAWINGS

FIG. 1 is a plan view of an illustrative photovoltaic device according to the teachings of the present invention.

FIG. 2 is a schematic view of an illustrative photovoltaic device according to the teachings of the present invention.

FIGS. 4A-H is a sectional view of an illustrative photovoltaic device according to the teachings of the present invention.

FIGS. 5A-B is a sectional view of an illustrative electrical terminal for a photovoltaic device according to the teachings of the present invention.

FIG. 5D is a perspective view of another illustrative electrical terminal for a photovoltaic device according to the teachings of the present invention.

FIG. 5E is a perspective view of another illustrative electrical terminal for a photovoltaic device according to the teachings of the present invention.

FIG. 6 is a plan view of an illustrative multiple photovoltaic devices according to the teachings of the present invention.

FIG. 7 is a plan view of an illustrative multiple photovoltaic devices according to the teachings of the present invention.

DETAILED DESCRIPTION OF THE PREFERRED EMBODIMENT

Figure 10:
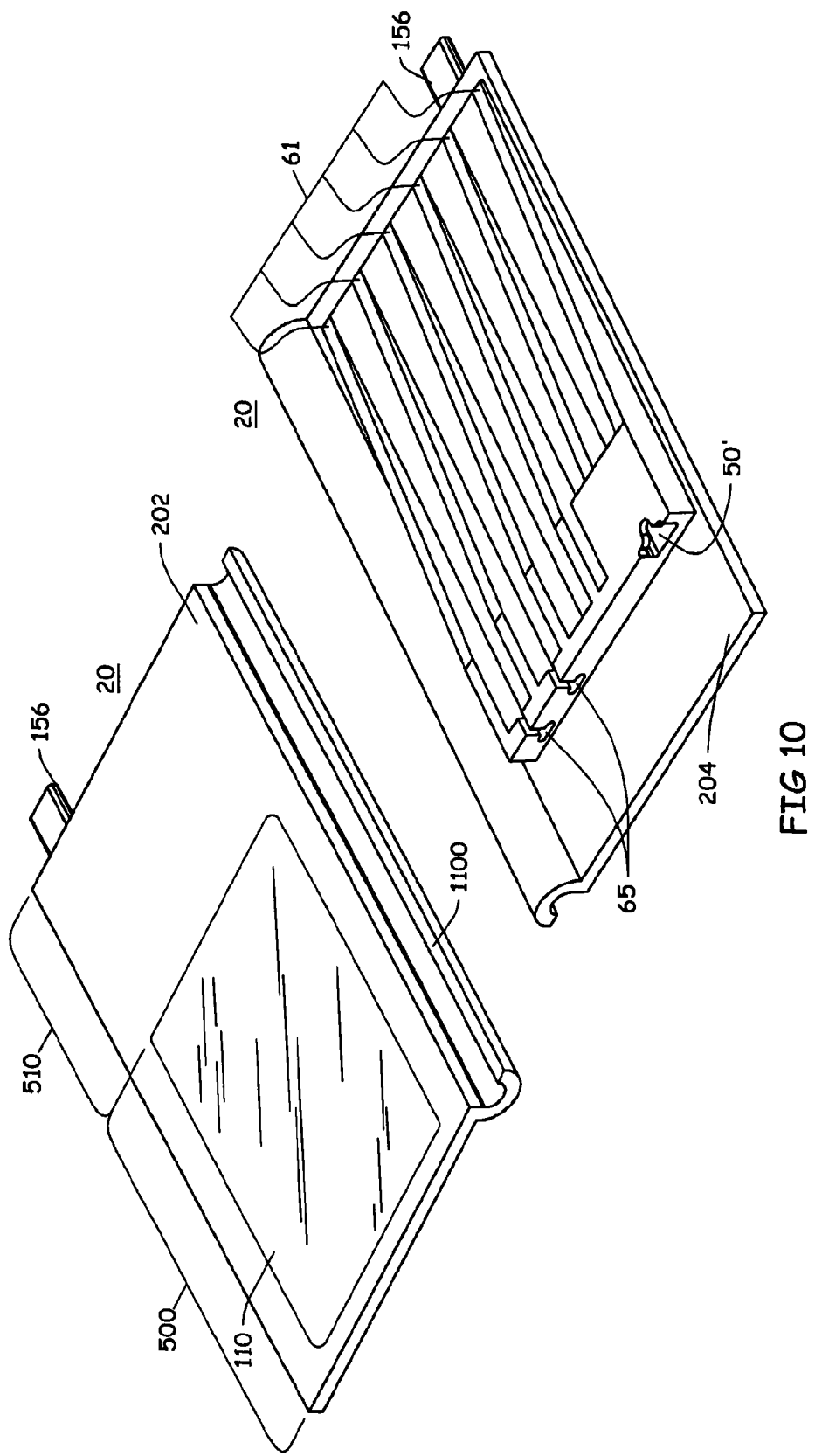
FIG. 10 is a top and bottom perspective view of an illustrative photovoltaic device for a column configuration according to the teachings of the present invention.

Referring to FIGS. 1 through 5, in a first configuration (row configuration), and FIG. 10 in a second configuration (column configuration), a photovoltaic device ("PVD") 20 according to the present invention may be described generally as including a photovoltaic cell assembly 100 and an inactive portion 200 (which may also be referred to as a body portion or in some instances where it provides structural support a body support portion). The body portion 200 having an upper surface portion 202, a lower surface portion 204 and side wall portion therebetween. The photovoltaic cell assembly 100 having a cell upper surface portion 102, a cell lower surface portion 104 and side wall portion therebetween. For the sake of brevity, the term "row" is utilized throughout the teachings/claims below, but it is understood that "row" and "column" may be considered interchangeable.

The photovoltaic cell assembly 100 may be further described as including a photovoltaic cell 110, protective layers 120, and at least some of the electrical circuitry 140 of the PVD. The body portion 200 may be further described as including a main body portion 210, a locator 220, a side body portion 230, and an optional bottom body portion 240.

The PVD 20 may also be described as having an active portion 500 and an inactive portion 510. The active portion 500 may include at least the photovoltaic cell 110, the side body portion 230 and the optional bottom body portion 240. The inactive portion may include at least the main body portion 210, a locator 220, and some or all of the electrical circuitry 140.

It is contemplated that the PVD 20 may be constructed at least partially of flexible materials (e.g. thin films or deformable materials, with significant plastic or elastic elongation such as plastics, synthetic and natural rubbers, films, elastomers, or the like) to allow at least some flexibility for conforming to an irregular contour in a building structure. It is also contemplated that it may be desirable to at least keep the photovoltaic cell 110 relatively rigid, generally to prevent any cracking of the cell and/or any barrier layers. Thus, some parts of the PVD 20 may be constructed with a more rigid material (e.g. glass plate or polymeric sheets or "Plexiglas"). Although, the photovoltaic cell 110 may be partially or substantially rigid, it is typically preferable for the PVD 20 to be generally flexible. For this invention, flexible means that the PVD is more flexible or less rigid than the substrate (e.g. building structure) to which it is attached. Preferably, the PVD 20 can bend about a 1 meter diameter cylinder without a decrease in performance or critical damage. For example, in the case of a PVD shingle, shingles generally are less rigid than the roof deck; the roof deck provides structural rigidity. In some other examples the roofing product itself provides the necessary rigidity and the roof deck is absent, or minimized.

Photovoltaic Cell Assembly

The photovoltaic cell 110, contemplated in the present invention may be constructed of any number of known photovoltaic cells commercially available or may be selected from some future developed photovoltaic cells. These cells function to translate light energy into electricity. The photoactive portion of the photovoltaic cell is the material which converts light energy to electrical energy. Any material known to provide that function may be used including crystalline silicon, amorphous silicon, CdTe, GaAs, dye-sensitized solar cells (so-called Gratezel cells), organic/polymer solar cells, or any other material that converts sunlight into electricity via the photoelectric effect. However, the photoactive layer is preferably a layer of IB-IIIA-chalcogenide, such as IB-IIIA-selenides, IB-IIIA-sulfides, or IB-IIIA-selenide sulfides. More specific examples include copper indium selenides, copper indium gallium selenides, copper gallium selenides, copper indium sulfides, copper indium gallium sulfides, copper gallium selenides, copper indium sulfide selenides, copper gallium sulfide selenides, and copper indium gallium sulfide selenides (all of which are referred to herein as CIGSS). These can also be represented by the formula $CuIn(1-x)Ga_xSe(2-y)S_y$ where x is 0 to 1 and y is 0 to 2. The copper indium selenides and copper indium gallium selenides are preferred. Additional electroactive layers such as one or more of emitter (buffer) layers, conductive layers (e.g. transparent conductive layers) and the like as is known in the art to be useful in CIGSS based cells are also contemplated herein. These cells may be flexible or rigid and come in a variety of shapes and sizes, but generally are fragile and subject to environmental degradation. In a preferred embodiment, the photovoltaic cell assembly 110 is a cell that can bend without substantial cracking and/or without significant loss of functionality. Exemplary photovoltaic cells are taught and described in a number of US patents and publications, including U.S. Pat. No. 3,767,471, U.S. Pat. No. 4,465,575, US20050011550 A1, EP841706 A2, US20070256734 a1, EP1032051A2, JP2216874, JP2143468, and JP10189924a, incorporated hereto by reference for all purposes.

Protective Layers

The PV cell assembly may include one or more protective layers 120, as illustrated in FIGS. 3 and 4A-H. These preferred protective layers may include a number of distinct layers that each serve to protect and/or connect the photovoltaic cell assembly 100 together. Each preferred layer is described in further detail below, moving from the "top" (e.g. the layer most exposed to the elements) to the "bottom" (e.g. the layer most closely contacting the building or structure). In general each preferred layer or sheet may be a single layer or may itself comprise sublayers.

The top layer or top sheet 122 may function as an environmental shield for the photovoltaic cell assembly 100 generally, and more particularly as an environmental shield for the photovoltaic cell 110. The top sheet 122 is preferably constructed of a transparent or translucent material that allows light energy to pass through to the photoactive portion of the photovoltaic cell 110. This material may be flexible (e.g. a thin polymeric film, a multi-layer film, glass, or glass composite) or be rigid (e.g. a thick glass or Plexiglas such as polycarbonate). The material may also be characterized by being resistant to moisture/particle penetration or build up. The top sheet 122 may also function to filter certain wavelengths of light such that preferred wavelengths may readily reach the photovoltaic cells. In a preferred embodiment, the top sheet 122 material will also range in thickness from about 0.05 mm to 10.0 mm, more preferably from about 0.1 mm to 4.0 mm, and most preferably from 0.2 mm to 0.8 mm. Other physical characteristics, at least in the case of a film, may include: a tensile strength of greater than 20 MPa (as measured by JIS K7127); tensile elongation of 1% or greater (as measured by JIS K7127); and a water absorption (23° C., 24 hours) of 0.05% or less (as measured per ASTM D570).

A first encapsulant layer 124 may be disposed below the top layer 122 and generally above the photovoltaic cell 110. It is contemplated that the first encapsulant layer 124 may serve as a bonding mechanism, helping hold the adjacent layers together. It should also allow the transmission of a desirous amount and type of light energy to reach the photovoltaic cell 110. The first encapsulant layer 124 may also function to compensate for irregularities in geometry of the adjoining layers or translated though those layers (e.g. thickness changes). It also may serve to allow flexure and movement between layers due to temperature change and physical movement and bending. In a preferred embodiment, first encapsulant layer 124 may consist essentially of an adhesive film or mesh, preferably an EVA (ethylene-vinyl-acetate) or similar material. The preferred thickness of this layer range from about 0.1 mm to 1.0 mm, more preferably from about 0.2 mm to 0.8 mm, and most preferably from about 0.25 mm to 0.5 mm.

The next of the protective layers 120, a second encapsulant layer 126, is generally connectively located below the photovoltaic cell 110, although in some instances, it may directly contact the top layer 122 and/or the first encapsulant layer 124. It is contemplated that the second encapsulant layer 126 may serve a similar function as the first encapsulant layer, although it does not necessarily need to transmit electromagnetic radiation or light energy.

The next of the protective layers 120, is the back sheet 128 which is connectively located below the second encapsulant layer 126. The back sheet 128 may serve as an environmental protection layer (e.g. to keep out moisture and/or particulate matter from the layers above). It is preferably constructed of a flexible material (e.g. a thin polymeric film, a metal foil, a multi-layer film, or a rubber sheet). In a preferred embodiment, the back sheet 128 material may be moisture impermeable and also range in thickness from about 0.05 mm to 10.0 mm, more preferably from about 0.1 mm to 4.0 mm, and most preferably from about 0.2 mm to 0.8 mm. Other physical characteristics may include: elongation at break of about 20% or greater (as measured by ASTM D882); tensile strength or about 25 MPa or greater (as measured by ASTM D882); and tear strength of about 70 kN/m or greater (as measured with the Graves Method). Examples of preferred materials include glass plate, aluminum foil, Tedlar® (a trademark of DuPont) or a combination thereof.

The next of the protective layers 120, is the supplemental barrier sheet 130 which is connectively located below the back sheet 128. The supplemental barrier sheet 130 may act as a barrier, protecting the layers above from environmental conditions and from physical damage that may be caused by any features of the structure on which the PVD 20 is subjected to (e.g. For example, irregularities in a roof deck, protruding objects or the like). It is contemplated that this is an optional layer and may not be required. It is also contemplated that this layer may serve the same functions as the body support portion 200. In a preferred embodiment, the supplemental barrier sheet 130 material may be at least partially moisture impermeable and also range in thickness from about 0.25 mm to 10.0 mm, more preferably from about 0.5 mm to 2.0 mm, and most preferably from 0.8 mm to 1.2 mm. It is preferred that this layer exhibit elongation at break of about 20% or greater (as measured by ASTM D882); tensile strength or about 10MPa or greater (as measured by ASTM D882); and tear strength of about 35 kN/m or greater (as measured with the Graves Method). Examples of preferred materials include thermoplastic polyolefin ("TPO"), thermoplastic elastomer, olefin block copolymers ("OBC"), natural rubbers, synthetic rubbers, polyvinyl chloride, and other elastomeric and plastomeric materials. Alternately the protective layer could be comprised of more rigid materials so as to provide additional roofing function under structural and environmental (ie. wind) loadings. Additional rigidity may also be desirable so as to improve the coefficient of thermal expansion of the PVD and maintain the desired dimensions during temperature fluctuations. Examples of protective layer materials for structural properties include polymeric materials such polyolefins, polyester amides, polysulfone, acetel, acrylic, polyvinyl chloride, nylon, polycarbonate, phenolic, polyetheretherketone, polyethylene terephthalate, epoxies, including glass and mineral filled composites or any combination thereof.

The above described layers may be configured or stacked in a number of combinations. Examples of three possible layering combinations are shown in FIGS. 4A-4H. These examples are not intended to be limiting and additional variations in the order of layers, number of layers, overlapping layer sections, or any combination thereof are contemplated. Additionally, these layers may be integrally joined together via any number of methods, including but not limited to: adhesive joining; heat or vibration welding; over-molding; or mechanical fasteners.

Electrical Circuitry

The electrical circuitry is at least partially contained within the PV cell assembly, but a portion of the electrical circuitry may be in the body portion or inactive portion of the PVD. The electrical circuitry 140, as illustrated in FIG. 2, may include a number of components that serve to electrically communicate the current to and/or from the PVD 20 to and or from a desired electrical device (e.g. a breaker box or electrical storage device). The components may include a buss wire 142, a bypass diode 144, at least two buss terminals 146, 148, and return circuit 150 with at least two return terminals 152, 154. It is contemplated that any or all of the above electrical components may be located within and integral to the photovoltaic cell assembly 100 or may be separately attached (e.g. the return circuit may not be part of the photovoltaic cell assembly 100).

The buss wire 142 is electrically connected to the photovoltaic cell 110. Functionally, the buss wire 142 provides a path for the current produced by the cell to move to the at least two terminals 146, 148. The buss wire may be constructed of any number of conductive or semi-conductive materials (e.g. metallic wire, metallic film, conductive polymers, or the like). In a preferred embodiment, the buss wire is constructed of a thin coated metallic strip (e.g. a silver coated strip of copper) that is about 0.1 mm thick and about 10 mm wide. It is preferred that the buss wire 142 range in thickness from about 0.05 mm to 2.0 mm, more preferably from about 0.1 mm to 1.0 mm, and most preferably from about 0.25 mm to 0.8 mm. Other physical characteristics may include relatively high conductivity (e.g. about $30.0 \times 10^6$ siemens per meter ($S \cdot m^{-1}$) or higher). Examples of preferred materials include copper, gold, brass, silver, conductive polymers, or combination thereof.

The bypass diode 144 is electrically connected in parallel to the buss wire 142. The bypass diode 144 functions such that the diode will conduct if the cell(s) become reverse biased. Alternatively, a diode may be connected anti-parallel across a part of the solar cells of a module. It protects these solar cells from thermal destruction in case of total or partial shading, broken cells, or cell string failures of individual solar cells while other cells are exposed to full light. The use of such bypass diodes is well known in the art and may be an optional component in the present invention.

Figure 3:
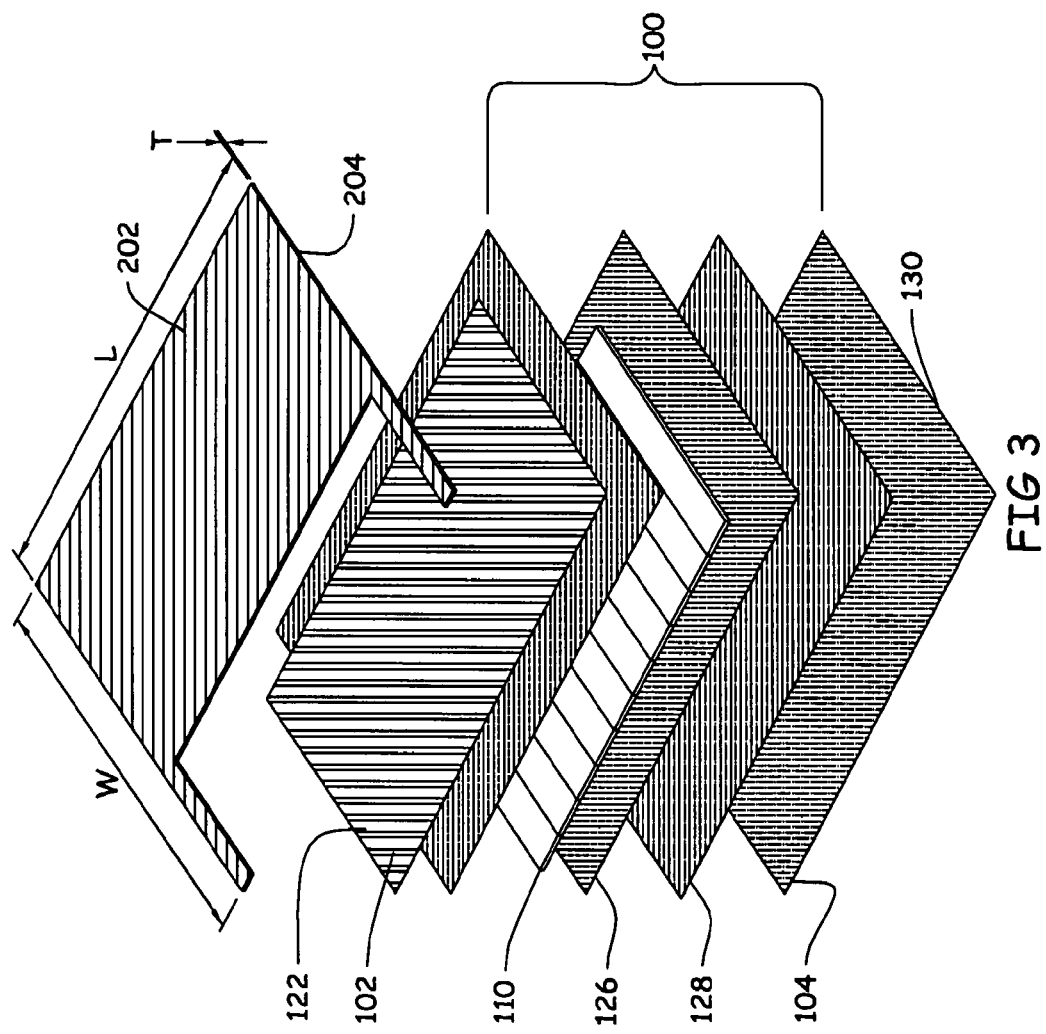
FIG. 3 is an exploded view of an illustrative photovoltaic device according to the teachings of the present invention.
Figure 4A:
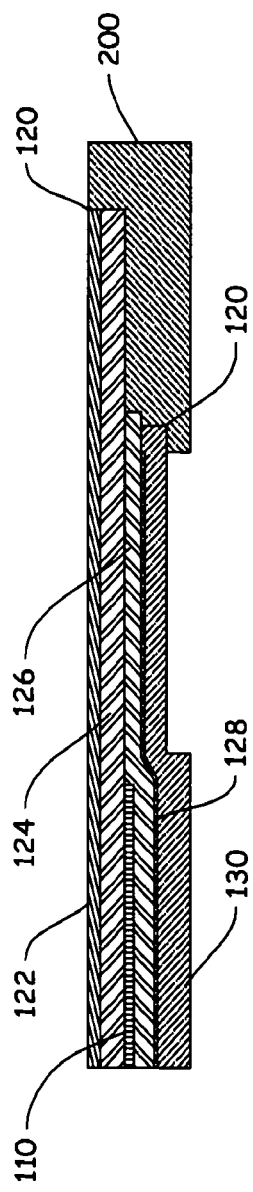
Figure 4B:
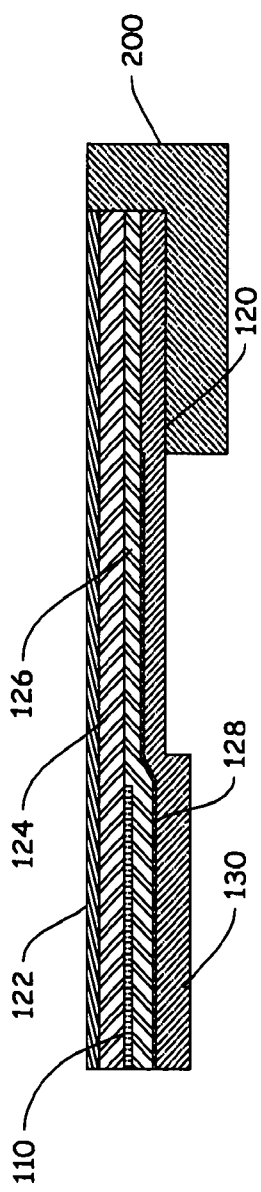
Figure 4C:
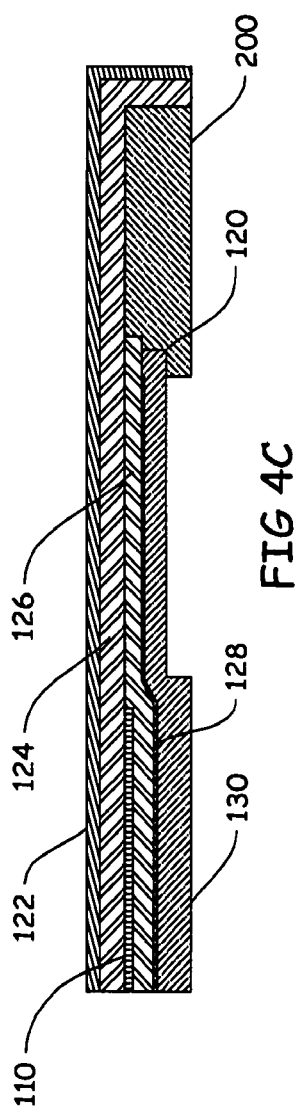
Figure 4D:
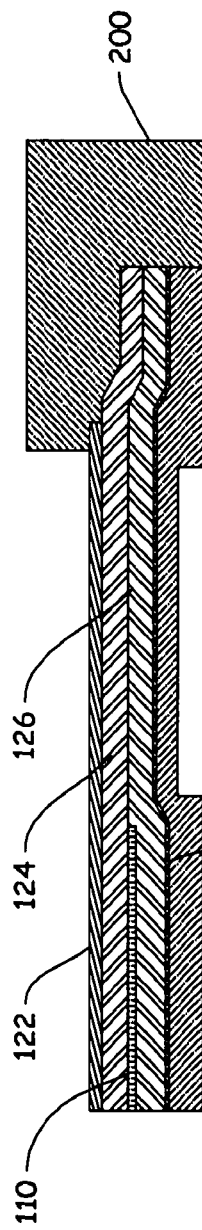
Figure 4E:
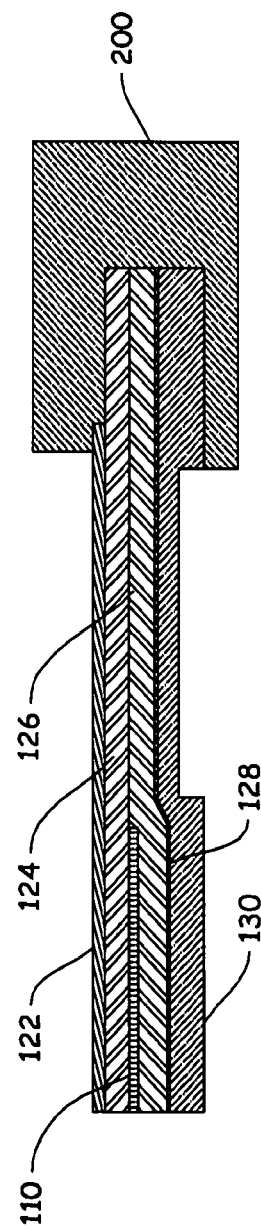
Figure 4F:
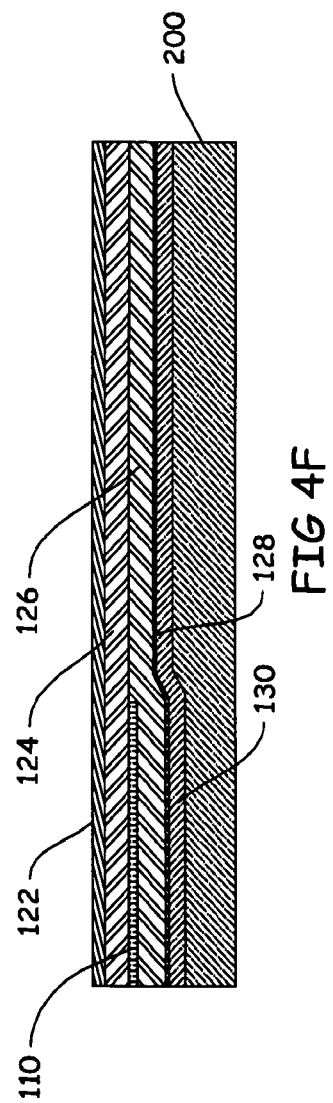
Figure 5C:
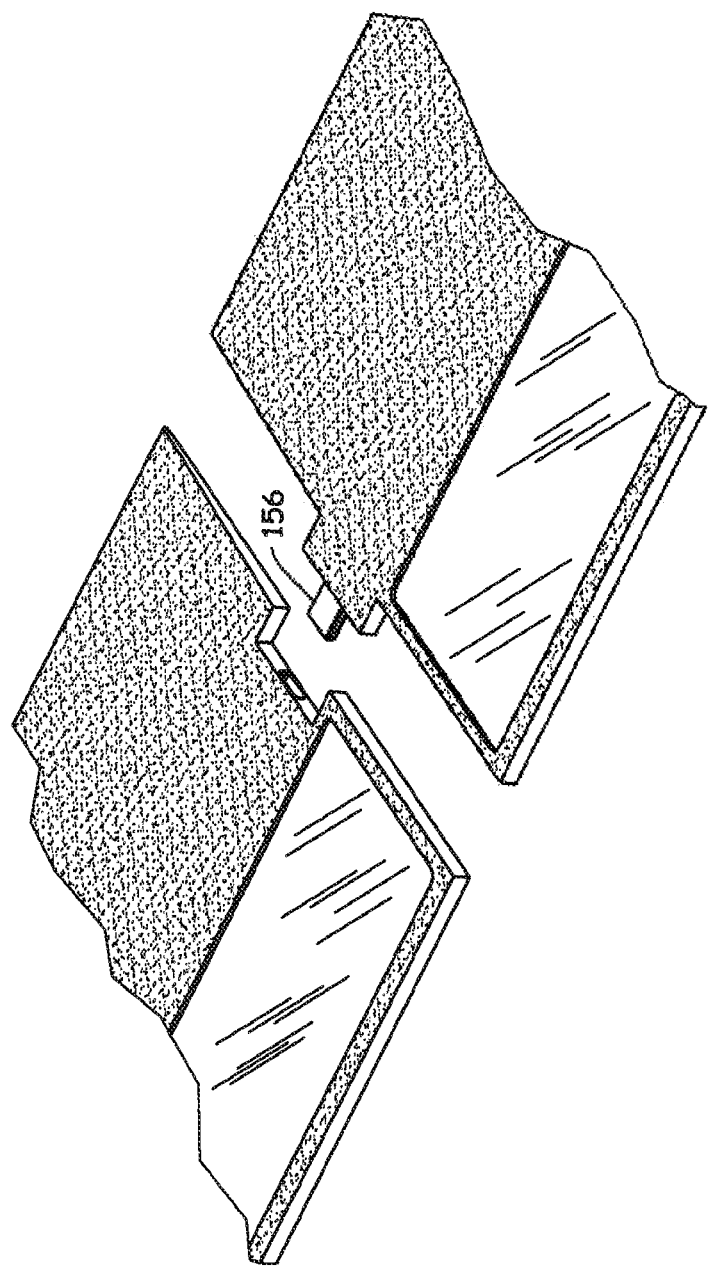
FIG. 5C is a perspective view of another illustrative electrical terminal for a photovoltaic device according to the teachings of the present invention.

The at least two buss terminals 146, 148 (one electrically positive, one electrically negative) are located at the ends of the buss wire 142 (e.g. one on each of the respective ends). The terminals serve as an electrical connection point to electrically communicate the current to and/or from the PVD 20 to and/or from a desired electrical device either directly or via the optional return circuit 150. The terminals may be configured in any number of physical configurations. In one preferred embodiment, as shown in FIGS. 5A-B, the terminals are adapted to accept a connection device (e.g. a screw 160). In this illustrated example, the connection screw connects two adjoining PVD 20 together. It is contemplated that other fastening devices may be used (e.g. nails, push pins, or the like), so long as an electrical connection with at least one terminal is made. In another aspect of the preferred embodiment, the terminals may be collocated with the locater 220. In another preferred embodiment, with an illustrative example as shown in FIG. 5C, a separate or an embedded connector 156 is utilized. Other connector configurations are contemplated in a co-pending patent application based upon U.S. Provisional Application No. 61/098,941, and is incorporated by reference for the express purpose of providing the locating and electrical connecting function between the PVDs. Illustrative examples of some of these other contemplated connector configurations are shown in FIGS. 5D-E. This may also be also known as a photovoltaic device connector assembly 156 according to the present invention may be described generally as including a base portion 30' including a first end portion 32', a second end portion 34' and an outer surface 36', where the outer surface may act as the locator. The locator may be further described as including a bearing wall 40' that may be shaped to generally complement an opposing female connector housing 50' that may be located in the photovoltaic device 20.

In yet another alternative the terminals can be separate from the locator (e.g. where a wire terminal is used to connect adjacent PVDs).

The optional return circuit 150, as show in FIG. 2, preferably runs across the PVD 20. Functionally, the return circuit 150 provides a return path for the current produced by the cell so that both positive and negative ends of the circuit can be on the same side of the PVD 20. The return circuit 150 may be constructed of any number of conductive or semi-conductive materials (e.g. metallic wire, metallic film, conductive polymers, or the like). In a preferred embodiment, the buss wire 142 is constructed of a thin coated metallic strip (e.g. a tin coated strip of copper) that ranges from about 0.1 mm to 1.0 mm thick and about 10 mm to 20 mm wide. Other physical characteristics may include relatively high conductivity (e.g. about $30.0 \times 10^6$ siemens per meter ($S \cdot m^{-1}$) or higher). Examples of preferred materials include copper, gold, brass, silver, conductive polymers, or combination thereof.

The at least two return terminals 152, 154, are located at or near the ends of the return circuit 150. Both functionally and structurally, the at least two return terminals 152, 154 may be similar to the buss terminals 146, 148. In a preferred embodiment, both sets of terminals (e.g. buss and return) are located in close proximity (within about 25 mm or less) to each other, collocated with the locator 220.

Inactive Portion/Body portion

The body portion 200, as shown in FIGS. 1-5 may include the main body portion 210, at least one locator 220 (preferably two locators 220, 222), the side body portion 230, and the optional bottom body portion 240. The inactive portion may be constructed of single or multiple pieces, preferably from a single polymeric article. The body support portion 200 functions as the main structural carrier for the PVD 20 and should be constructed in a manner consistent with this. For example, the inactive portion can essentially function as a plastic framing material. In a preferred embodiment, the body support portion 200 is constructed from a filled or unfilled moldable plastic (e.g. polyolefins, acrylonitrile butadiene styrene (SAN), hydrogenated styrene butadiene rubbers, polyester amides, polysulfone, acetel, acrylic, polyvinyl chloride, nylon, polyethylene terephthalate, polycarbonate, thermoplastic and thermoset polyurethanes, synthetic and natural rubbers, epoxies, SAN, Acrylic, polystyrene, or any combination thereof). Fillers may include one or more of the following: colorants, fire retardant (FR) or ignition resistant (IR) materials, reinforcing materials, such as glass or mineral fibers, surface modifiers. Plastic may also include anti-oxidants, release agents, blowing agents, and other common plastic additives.

It is contemplated that the body portion 200 may be any number of shapes and sizes. For example, it may be square, rectangular, triangular, oval, circular or any combination thereof. The body portion 200 may have a length (L) and a width (W) of as little as 10 cm and as much as 100 cm or more, respectively. It may also have a thickness (T) that may range from as little as about 5 mm to as much as 20 mm or more and may vary in different area of the body support portion 200. In one preferred embodiment, the body portion 200 is rectangular in shape with a thickness of about 10 mm and a length (L) of about 95 cm and a width (VV) of 25 cm.

It is contemplated that all or a portion of the inner surface portion (that is that side of the body portion proximate the building surface) can be solid (e.g. a unitary block) or have geometric features (e.g. ribs 61 for example as shown in FIG. 10). The geometric features may contain channels so as to be permit the press-fit of wiring into said channels.

The body portion 200 is joined to the photovoltaic cell assembly 100 along at least a portion of a bottom segment 212 of the main body portion 210. Preferably, they are also joined along at least a portion of a side segment 232 or segments 232, 234 of the side body portion 230. The joining of the body portion 200 to the photovoltaic cell assembly 100 may be accomplished by an adhesive, lamination, over molding, or a combination thereof. The joining interface should be moisture and particulate impermeable. In a preferred embodiment, the body portion 200 and the photovoltaic cell assembly 100 are joined via an over molding process, described in more detail in the below example.

It is contemplated that the body support portion 200 may partially enclose or fully surround at least one edge portion 102 of the photovoltaic cell assembly 100, while leaving the at least 90% (preferably at least 98% or more) of the top surface of the photovoltaic cell 110 exposed. Various contemplated configurations are shown in FIGS. 4A-F. In a preferred embodiment, the body support portion 200 at the bottom segment 212 fully surrounds a top edge portion of the photovoltaic cell assembly 100; including at least part of the electrical circuitry 140 (e.g. part of the buss wire, the buss terminals, the bypass diode, and the optional return circuit). Also, in this preferred embodiment, the body support portion 200 at the side body portion 230 at least partially encloses a side edge portion 106 of the photovoltaic cell assembly 100. Optionally, the body support portion 200 at the optional bottom body portion 240 at least partially encloses a bottom edge portion 108 of the photovoltaic cell assembly 100.

It is contemplated that the main body portion 210 of the body support portion 200, as shown in FIGS. 4A-H, is generally the area of the PVD 20 that is located above the photovoltaic cell 110. It is contemplated that the main body portion 210 may also include the at least one locator 220. Additionally, the main body portion 210 may include a fastening area 214 for fastening (e.g. via nail, screw or the like) the PVD 20 to the building structure. This fastening area is preferably devoid of any functional components (e.g. the electrical circuitry 140) and may be physically marked on the surface of the main body portion 210.

It is contemplated that at least one locator 220 is disposed on a peripheral edge of the body support portion 200. The locator 220 functions to aid the positioning of one PVD 20 to another PVD 20, and allows for rotational adjustments therebetween. The locator 220 may protrude from and/or may be recessed from the peripheral edge of the body support portion 200. It also may be integrally formed as part of the body support portion 200 or may be a separate component. The locator 220 is adapted to function to secure one PVD 20 to another PVD 20. They may be secured via the use of a mechanical fastener such as a nail, screw, spring clip or any other means. Preferably, the locator 220 may protrude a distance into or from the edge of the inactive portion 220 a distance (D). This distance (D) preferably ranging from about 5 to 40 mm, more preferably ranging from about 15 to 35 mm and most preferably from about 20 to 30 mm.

In a preferred embodiment, as shown in FIG. 1, a first locator 220 and a second locator 222 are semi-circular in shape, adapted to mate with each other, and include a through hole 224 for the fastener (e.g. screw 160). The first locator 220 protrudes from the top half (or a proportion of the thickness (T)) of the peripheral edge (in the main body portion 210) and is recessed in a similar fashion on the bottom half. The second locator 222 is generally a mirror image of the first locator 220 and preferably located on an opposite side of the PVD 20. The locators 220, 222 are also preferably configured so that a small gap 226 (e.g. about 15 mm or less) is maintained between the PVDs, thus allowing for the rotational adjustment.

It is contemplated that at least one of the buss terminals 146 is collocated within the locator 220, preferably one buss terminal 146 with one locator 220 and the other buss terminal 148 with the opposing locator 222. Also, at least one of the return terminals 152 may also be collocated within the locator. Where the terminal or terminals are collocated within the locator 220, they may be adapted to utilize the fastener described above to complete the electrical circuit between the adjoining PVDs. This may allow for electrically stringing multiple PVDs together without the need for additional wiring.

It is contemplated that the side body portion 230 may be a strip of inactive portion material that is located next to and joined with the side edge portion 106 of the photovoltaic cell assembly 100. The side body portion may include the above described locators 220, 222 although preferably the locators 220, 222 are substantially located in the main body portion 210. As with the rest of the body support portion 200, the side edge portion 230 at least partially encloses a side edge portion 106 of the photovoltaic cell assembly 100.

The side body portion 230 may have a width (SVV) of a little as about 2 mm and as much as about 20 mm or more. The length (SL) may be from as little as about 10 mm to as much as 200 mm or more. It may also have a thickness (ST) essentially the same as the rest of the body support portion 200; although in one preferred embodiment it is about half the thickness of the main body portion 210.

It is contemplated that the optional bottom body portion 240 may be a strip of inactive portion material that is located next to and joined with the bottom edge portion 108 of the photovoltaic cell assembly 100. Preferably, if the bottom portion 240 is included, the joint with the photovoltaic cell assembly 100 is substantially flush on the exposed top surface, so that water and/or other materials do not get trapped on the PVD 20.

In a second aspect, referring to FIGS. 6 and 7, the invention contemplates a method of installing a photovoltaic system 300 of multiple PVDs 20, as described previously, on a building structure. A building structure may include structures such as a roof, a wall, exposed portion or any other structure attached thereto. In one embodiment, the PVDs 20 may be preferably installed in an off-set overlapping mode (e.g. as are common roofing shingles). The installation method may include the step of placing on the building structure a PVD 20 with electrical terminals 146, 148 on both ends and fastening it to the building structure. The electrical terminals 146, 148 (e.g. the buss terminals and/or the return terminals) may also be combined with the locators 220, 222 and serve as the locators for the next PVD 20. The second PVD 20 may be located proximate the first shingle based on the first connector, then aligned as desired, which is typically square to one edge of the building structure. The second PVD 20 may then fastened to the building structure (e.g. with a mechanical fastener through the upper surface portion 202 in the main body portion 210) and the electrical terminals 146, 148 connected (generally via a screw fastener or other mechanical means). Additional PVDs 20 may be added to a row or column in a similar manner. A line or marking for defining a fastening zone may be provided on the main body portion 210 of the PDV 20, preferably in the fastening area 214, to show the installer where to nail or fasten.

A second row or column overlapping the first may then be added, as illustrated in FIG. 7. The active portion 500 of the second row or column of PVDs 20 may be offset compared to the first row or column of PVDs 20 and overlap the inactive portion 510 of the first row or column so as to cover the electrical terminals 146, 148 of the first row or column of devices, and as with conventional cladding materials, covering the fastener (e.g. nails, staples, or the like) used to attach the device to the building structure.

As is the case with conventional cladding materials, this installation method may help reduce or eliminate leaks between PVDs 20 because of the off-set overlap. The ability to install in this manner and use electrical terminals integral to the PVDs 20 may be enabled by the unique terminal and locator system designed into the PVD 20. This may help eliminate any additional electrical interconnecting materials between photovoltaic devices 20 and may allow for installation of each row or column as one would install traditional cladding materials (e.g. roofing shingles or tiles). The row or column of interconnected photovoltaic devices 20 may be connected to the "balance of systems" or BOS, as is known in the art, to create the desired power output.

An illustrative example wherein the PVDs 20 are used in a roofing application as a PV shingle array (e.g. the photovoltaic system 120) are shown FIG. 6. This illustrates how the terminal and locator system may permit alignment of the photovoltaic devices 20 via rotation (e.g. referring to FIG. 6—rotating the second photovoltaic device 20 around the locator to align device edges to a reference line (e.g. chalk line) as needed.) The amount of rotational freedom between devices may be limited by an allowance gap 226. It is contemplated that the allowance gap 226 can also serve as a drainage path for liquids and debris. This allowance gap 226 may be increased or decreased by changing the geometry of the locator 220, 222.

FIG. 7 shows a partial view of an assembled PV shingle array using the inventive PVDs 20 (e.g. as shingles). In this example, the combined locators 220, 222/terminals 146, 148 in the bottom row are covered and protected from weather elements by the overlapping region of the next higher row of shingles.

The dimensions of the active portion 500 may be any desired size and one that is convenient for a PV cell manufacturer to produce. However, for aesthetic reasons and in the case where the device is used as a roofing shingle, it may be desirable for the completed PVD 20 to have a dimension similar to a conventional roofing tile or shingle used on the building industry. The dimensions of the inactive portion 510 may be determined by the need to incorporate the desired circuitry, but may otherwise be as large as desired. In the roofing shingle case, it is preferred that they be of a size such that when mated with the active portion 500, the product has dimensions similar to conventional roofing materials used in the geographic region where it is to be installed.

In second configuration, as seen in FIG. 10, a similarly constructed PVD is shown that is adapted to be used in a column configuration. The electrical connections/locators may be located on the top and bottom of the PVD 20 as opposed to the sides as in a row configuration. Also shown is an exemplary channel 65 that may be utilized as a holding device for any external wiring that may be used (for either column or row configurations)

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

Injection Molding Example

Figure 9:
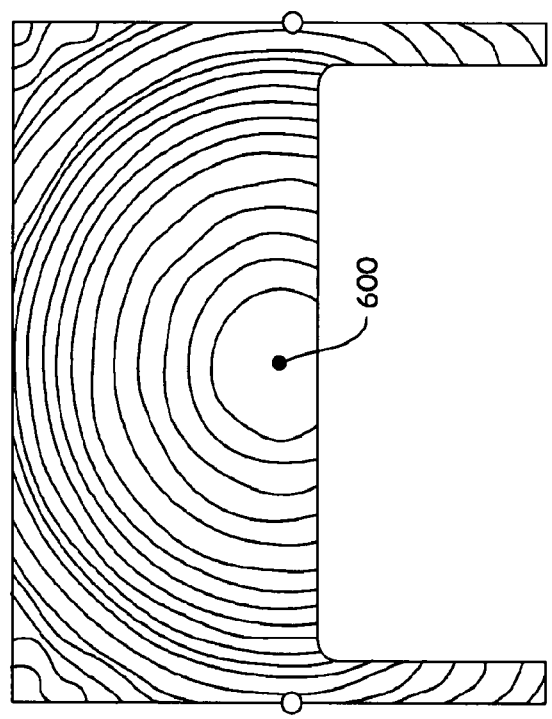
FIG. 9 is a plan view of an example of polymer flow according to the teachings of the present invention.
Figure 8:
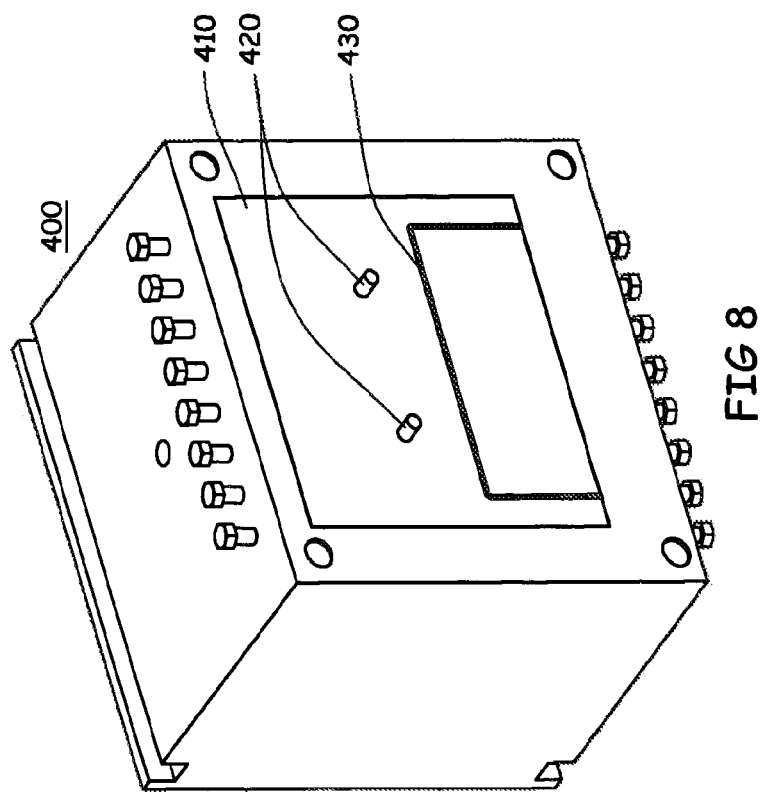
FIG. 8 is a perspective view of a mold according to the teachings of the present invention.

As shown in FIGS. 8 and 9, and described below is an illustrative example of an injection molding construction process for the PVD 20. In this example an body support portion 200 is created (e.g. injection molded) and joined to a premade photovoltaic cell assembly 100 via over molding. Over molding being defined as a process where one or more components are placed in or around a mold and a polymer is introduced to the mold to selectively surround the one or more components. It is contemplated that this exemplary process may accommodate a variety of top sheet 122 materials including moldable plastic compositions known in the art, as well as glass sheet. This exemplary process to make the PVD 20 of the present invention incorporates the following steps:

First, provide a photovoltaic cell assembly 100 as described above.

Second, place the photovoltaic cell assembly 100 of Step 1 into a molding cavity 410 of a thermoplastic injection molding tool 400, shown in FIG. 8, locating the photovoltaic cell assembly 100 in a desired position within the tool using the locating features 420.

The photovoltaic cell assembly 100 could be located through precision placement (e.g. via robotics, etc) or through integrally designed physical features. These features may be part of the existing photovoltaic cell assembly 100 (for example: electrical components such as connector contacts or buss wires, the laminate edge, or changes in the laminate geometry, such as thickness) or designed explicitly for this function (for example: cut-outs in the laminate in the form of holes or slots, or irregularities as depressions, protrusions, etc). The photovoltaic cell assembly 100 of step one may be designed such that the electrical terminals 146, 148 exit the PVD 20 at any position, but it is preferred that the electrical terminals 146, 148 are collocated with the locators 220, 222 of the PVDs 20. These features can also serve to locate the PVDs with respect to one another in the roofing assembly as shown in FIGS. 6 and 7.

After insertion of the photovoltaic cell assembly 100 into the molding cavity 410 as described in the placement step, a molten polymer under an appropriate pressure, flow rate, and temperature is forced into the cavity so as to fill the space in the mold cavity 410 not occupied by the photovoltaic cell assembly 100 completely, displacing all air in the cavity 410. The tool is designed to accommodate the forces of the pressurized polymer imparted to the cavity 410 and photovoltaic cell assembly 100 during the molding process so as to give the final part the desired shape and to incorporate other attributes into the final part. Such attributes may include, but are not limited to, locating devices to aid in installation of the PVD 20, additional sealing of the edges of the photovoltaic cell assembly 100, and affecting the curvature or bowing of the final over-molded product.

The injection molding cavity 410 and photovoltaic cell assembly 100 may be designed such that the high pressure polymer either forces or balances so as to properly position the photovoltaic cell assembly 100 for surrounding or control at the edges. Polymer pressures can be from a few hundred Kg/cm to 2500 Kg/cm or more in injection molding, thereby easily bending and manipulating the laminate to its designed shape. It is widely accepted that polymer flows in a "fountain" with the greatest flow volume at the center of the cavity (e.g. a gate point 600), and zero flow with freezing at the walls. This attribute forces the photovoltaic cell assembly 100 to the wall in most cases, which can be undesirable. However, by combining the proper photovoltaic cell assembly 100 stiffness, flow directions, and tooling design, the photovoltaic cell assembly 100 may be located in the center of the polymer melt for a photovoltaic cell assembly 100 of proper stiffness, thereby, environmentally sealing and physically protecting the photovoltaic cell assembly edge portion 102 from damage. An example of polymer flow is shown in FIG. 10.

The photovoltaic cell assembly 100 may require protection from the high pressures and thermal stresses in the subsequent molding operation. Features in the injection molding tool may be incorporated to compress the photovoltaic cell assembly 100 in local areas, or alternatively over a broad area, when the mold is closed, to isolate these forces and restrict the flow of molten polymer from the photovoltaic cell assembly 100. These features compressing the photovoltaic cell assembly 100 are generally not on an active part of the photovoltaic cell 110, but on a thin band at the edge of the photovoltaic cell 110 (e.g. 1 mm to about 25 mm) to maximize the active photovoltaic cell 110 area and allow for the durable over-molding area. This compression band 430 may be of appropriate projection on the injection molding tool surface, such as to compress the photovoltaic cell assembly 100 sufficiently to seal off molten polymer during the high pressure injection molding process and isolate the forces induced during the over-molding process.

It is also contemplated that in another embodiment, the compression band 430 is spread across a broader area (e.g. 10%, 20%, 50% or more) of the photovoltaic cell assembly 100. This may be advantageous to the processing and tooling, particularly if the risk of damaging the active part of the photovoltaic cell 110 is minimal.

It is contemplated that a variety of polymers may be used in the over-molding process. For a PVD 20, it may be desirable that the polymer used in the body support portion 200 resist environmental degradation for the desired service life of the PVD 20. Current practice may suggest that this needs to be 25 years or more. Useful polymers may include polyethylene, polypropylene, TPO's, OBC's, thermoplastic urethanes, silicones, and many other polymers with and without fillers (including materials described previously).

The over-molded PVD 20 is cooled (for example via a water cooled mold) and removed from the mold cavity 410. Preferably, no trimming or further processing is required.

Unless stated otherwise, dimensions and geometries of the various structures depicted herein are not intended to be restrictive of the invention, and other dimensions or geometries are possible. Plural structural components can be provided by a single integrated structure. Alternatively, a single integrated structure might be divided into separate plural components. In addition, while a feature of the present invention may have been described in the context of only one of the illustrated embodiments, such feature may be combined with one or more other features of other embodiments, for any given application. It will also be appreciated from the above that the fabrication of the unique structures herein and the operation thereof also constitute methods in accordance with the present invention.

The preferred embodiment of the present invention has been disclosed. A person of ordinary skill in the art would realize however, that certain modifications would come within the teachings of this invention. Therefore, the following claims should be studied to determine the true scope and content of the invention.

Any numerical values recited in the above application include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes.

The term "consisting essentially of" to describe a combination shall include the elements, ingredients, components or steps identified, and such other elements ingredients, components or steps that do not materially affect the basic and novel characteristics of the combination.

The use of the terms "comprising" or "including" to describe combinations of elements, ingredients, components or steps herein also contemplates embodiments that consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps. All references herein to elements or metals belonging to a certain Group refer to the Periodic Table of the Elements published and copyrighted by CRC Press, Inc., 1989. Any reference to the Group or Groups shall be to the Group or Groups as reflected in this Periodic Table of the Elements using the IUPAC system for numbering groups.

What is claimed is:

1. A photovoltaic device comprising:
 a photovoltaic cell assembly including one or more photovoltaic cells, one or more protective layers and at least some electrical circuitry wherein the photovoltaic cell assembly has an upper surface portion, a lower surface portion and a sidewall portion therebetween forming at least one peripheral edge, and the upper surface portion allows transmission of light energy to the one or more photovoltaic cells for conversion into electrical energy;
 a body portion comprising a polymeric framing material having a main body portion including a lower surface portion that contacts a building structure, and an upper surface portion that receives a fastener that attaches the photovoltaic device to the building structure, at least two side body portions and a locator;
 wherein the body portion is join by overmolding to the photovoltaic cell assembly to enclose at least three sides of the peripheral edge of the photovoltaic cell assembly while leaving the upper surface portion of the photovoltaic cell assembly exposed, and further wherein the locator is adapted to locate the photovoltaic device relative to another photovoltaic device during installation of the photovoltaic device directly to the building structure and the locater is disposed on a peripheral edge of the body portion and includes:
 a) at least one electrical terminal, and provides
 b) rotational adjustment between the photovoltaic device and another photovoltaic device:
 wherein the locator protrudes from the peripheral edge of the body portion such that a small gap is maintained between adjacent photovoltaic devices attached to the building structure.

2. The photovoltaic device of claim 1, wherein the locator is included in a separate connector, an embedded connector, or a photovoltaic device connector assembly.

3. The photovoltaic device according to claim 1 which further comprises one or more separate connectors for connecting the photovoltaic device to other photovoltaic devices wherein the one or more separate connectors provide electrical connection between photovoltaic devices.

4. A photovoltaic device comprising
 a photovoltaic cell assembly including one or more photovoltaic cells, one or more protective layers and at least some electrical circuitry wherein the photovoltaic cell assembly has an upper surface portion, a lower surface portion and a sidewall portion therebetween forming at least one peripheral edge, and the upper surface portion allows transmission of light energy to the one or more photovoltaic cells for conversion into electrical energy;
 a body portion comprising a polymeric framing material having a main body portion including a lower surface portion that contacts a building structure, and an upper surface portion that receives a fastener that attaches the photovoltaic device to the building structure, at least two side body portions and a locator;
 wherein the body portion is join by overmolding to the photovoltaic cell assembly to enclose at least three sides of the peripheral edge of the photovoltaic cell assembly while leaving the upper surface portion of the photovoltaic cell assembly exposed, and further wherein the locator is adapted to locate the photovoltaic device relative to another photovoltaic device during installation of the photovoltaic device directly to the building structure and the locater is disposed on a peripheral edge of the body portion and includes:
 a) at least one electrical terminal, and provides
 b) rotational adjustment between the photovoltaic device and another photovoltaic device:
 wherein the at least one peripheral edge contains a female connector housing; and the locator is pant, of a separate component comprising a connector assembly having a bearing wall shaped to complement and is connected to the female connector housing and protrudes from the peripheral edge of the body portion in a direction of the another photovoltaic device.

5. The photovoltaic device of claim 4, wherein the photovoltaic device is flexible and conforms to variability in contour in the building structure.

6. A method of installing a photovoltaic system on a building structure, comprising the steps of:
 a) providing a first photovoltaic device and a second photovoltaic device according to claim 4;
 b) attaching the first photovoltaic device directly to a roof deck, an exterior wall or an awning of the building structure or a protective sheath of a roof deck, an exterior wall or an awning of the building structure by affixing a fastener through the main body portion of the first photovoltaic device;

c) locating and aligning the second photovoltaic device adjacent to the first photovoltaic device by rotation of the second photovoltaic device about the protruding locator while in contact with the building structure and attaching the second photovoltaic device to the building structure by affixing a fastener through the main body portion of the second photovoltaic device; and d) connecting at least one integrally formed electrical terminal of the first photovoltaic device to at least one integrally formed electrical terminal of the second photovoltaic device.

7. The method according to claim 6, further including the step of placing a fastener through a hole in the at least one integrally formed electrical terminal of the first photovoltaic device and through a hole in the at least one integrally formed electrical terminal of the second photovoltaic device to accomplish an electrical connection.

8. The method according to claim 7, wherein the fastener is a screw.

9. The method according of claim 6, including a photovoltaic device connector assembly to accomplish an electrical connection.

10. The method according to claim 6 wherein the step d is performed utilizing a separate connector wherein the connector provides electrical connection between the first photovoltaic device and the second photovoltaic device.

11. The photovoltaic device of claim 4, wherein an edge of the polymeric framing material seal and protect an active portion against the environment without the use of additional adhesives.

12. The photovoltaic device of claim 4, wherein there are at least two locators disposed on opposing sides of the photovoltaic device.

13. The photovoltaic to device according to claim 12 wherein the locators are integral to the body portion.

14. The photovoltaic device of claim 4, including a return circuit comprising a buss wire and two return terminals connected to the buss wire.

15. The photovoltaic device according to claim 4 wherein the body portion is molded about the photovoltaic cell assembly.

16. The photovoltaic device according to claim 4 wherein a bus terminal and a return terminal are collocated in the locator.

17. A photovoltaic device comprising a photovoltaic cell assembly including one or more photovoltaic cells, one or more protective layers and at least some electrical circuitry wherein the photovoltaic cell assembly has an upper surface portion, a lower surface portion and a sidewall portion therebetween forming at least one peripheral edge, and the upper surface portion allows transmission of light energy to the one or more photovoltaic cells for conversion into electrical energy;

a body portion comprising a polymeric framing material having a main body portion including a lower surface portion that contacts a building structure, and an upper surface portion that receives a fastener that attaches the photovoltaic device to the building structure, at least two side body portions and a locator;

wherein the body portion is join by overmolding to the photovoltaic cell assembly to enclose at least three sides of the peripheral edge of the photovoltaic cell assembly while leaving the upper surface portion of the photovoltaic cell assembly exposed, and further wherein the locator is adapted to locate the photovoltaic device relative to another photovoltaic device during installation of the phtovoltaic device directly to the building structure and the locater is disposed on a peripheral edge of the body portion and includes:

a) at least one electrical terminal, and provides b) rotational adjustment between the photovoltaic device and another photovoltaic device:

wherein the locator is part of an embedded connector integral to the at least one peripheral edge of the photovoltaic device assembly and protrudes from the peripheral edge in a direction of the another device and comprises a bearing wail shaped to complement and connect to a female connector housing of the another photovoltaic device assembly.

* * * * *

UNITED STATES PATENT AND TRADEMARK OFFICE
CERTIFICATE OF CORRECTION

PATENT NO. : 8,938,920 B2  Page 1 of 1
APPLICATION NO. : 12/989745
DATED : January 27, 2015
INVENTOR(S) : Robert J. Cleereman It is certified that error appears in the above-identified patent and that said Letters Patent is hereby corrected as shown below:

In the Claims

Column 15, Line 65, Claim 1, "join" should be "joined"
Column 16, Line 38, Claim 4, "join" should be "joined"
Column 16, Line 52, Claim 4, "pant" should be "part"
Column 18, Line 21, Claim 17, "join" should be "joined"
Column 18, Line 28, Claim 17, "phtvoltaic" should be "photovoltaic"
Column 18, Line 38, Claim 17, "wail" should be "wall"

Signed and Sealed this
Twenty-sixth Day of May, 2015

Michelle K. Lee
*Director of the United States Patent and Trademark Office*